US006125188A

United States Patent [19]
Hennessy

[11] Patent Number: 6,125,188
[45] Date of Patent: Sep. 26, 2000

[54] COMPACT PERSONAL MONITOR SYSTEM

[75] Inventor: Matthew C. Hennessy, Whangarei, New Zealand

[73] Assignee: Matthew C Hennessy, Whangarei, New Zealand

[21] Appl. No.: 08/953,735

[22] Filed: Oct. 20, 1997

[30] Foreign Application Priority Data

Oct. 18, 1997 [NZ] New Zealand .......................... 299609

[51] Int. Cl.[7] .................................................. H03G 5/00
[52] U.S. Cl. .................................................. 381/98; 381/55
[58] Field of Search .................................. 381/55, 98, 56, 381/58, 59, 77, 79, 82

[56] References Cited

U.S. PATENT DOCUMENTS

| | | | |
|---|---|---|---|
| 4,014,597 | 3/1977 | Griffin, Jr. . | |
| 4,237,339 | 12/1980 | Bunting . | |
| 4,324,951 | 4/1982 | Brown | 381/77 |
| 4,327,250 | 4/1982 | Von Recklinghausen | 381/55 |
| 4,481,663 | 11/1984 | Spranger . | |
| 5,193,119 | 3/1993 | Tontini et al. | 381/182 |
| 5,197,102 | 3/1993 | Sondermeyer | 381/96 |
| 5,209,665 | 5/1993 | Billings et al. | 434/169 |
| 5,467,400 | 11/1995 | Keir | 381/61 |

*Primary Examiner*—Ping Lee

[57] ABSTRACT

A compact personnel monitor speaker system for live music sound reinforcement monitoring introduces insignificant electrical loading and reliably connects directly to high power audio amplifiers. The monitor speaker includes a device for mounting onto a microphone stand, music stand or other stand in close proximity to the user.

5 Claims, 4 Drawing Sheets

COMPACT PERSONAL MONITOR SYSTEM

BACKGROUND OF THE INVENTION

1. Field of the Invention

The present invention relates in general to electro acoustical transducing and more particularly concerns a speaker system for providing sound monitoring.

2. Description of Prior Art

Conventional monitor speakers, also known as foldback speakers, are widely used in the field of live sound reinforcement to allow performers to hear themselves and other performers. Conventional monitor speakers are typically medium size sound reinforcement speakers with an irregular wedge shape that allows them to be placed on the floor in front of the performers with the sound directed back up at the performers. Conventional monitor speakers can also be full size sound reinforcement speakers filling the stage from the sides. Alternatively, monitor speakers can be compact, in close proximity to the user. Conventional monitor speakers require specialized interconnecting cables and are designed to be either driven by a dedicated amplifier system, separate from the main sound system amplifier or have a built-in amplifier. Both styles add additional cost, weight, and set-up procedures to the entire sound system.

SUMMARY OF INVENTION

The present invention is particularly suited to use with portable sound reinforcement systems for live music performers. The invention is a compact speaker system that mounts nearby the user, has a nominal input impedance of greater than 30 ohms and is connected directly into high powered amplifiers. The compact size, light-weightness and simplicity of use and adjustment reduces set-up time, transport effort, storage space, and overall cost when compared to conventional monitor speaker systems.

The invention utilizes the acoustical phenomena that bass frequencies below 200 Hz are omni-directional. While performers can adequately hear the bass emanating from their main speaker system they cannot adequately hear the upper frequencies. The invention is wired directly to the main sound reinforcement amplifier in parallel with the main speaker system and provides a small portion of the upper frequencies from the main sound reinforcement amplifier as foldback to the performer to add clarity to the mid-range and treble that the performer cannot adequately hear in the spill over from the main speaker system.

The invention is small and light weight and may be easily attached to a microphone stand, drum stand, music stand, keyboard stand, or other stand, in close proximity to the performer pointed at their ears. The invention is so compact that several can be stowed away with cables and microphones for easy transportation.

In a preferred embodiment a 4 inch full range dynamic driver of nominal 32 ohm impedance is mounted in a small space enclosure of about 50 cubic inches. Total weight is less than 3 lbs. A passive network is utilized to filter out bass frequencies and control the volume level while transferring a higher impedance to the amplifier serving to increase the power handling capability of the driver while introducing comparatively insignificant additional loading to the amplifier which is already loaded by the main sound reinforcement speakers. An added advantage of filtering out the bass is the invention is not prone to feed back caused by open ringing strings on acoustic guitars.

The preferred embodiment includes an adjustable mounting clip which may be permanently attached to a stand. The mounting clip has a tab which mates to a mounting slot on the invention for instant attachment and removal.

Other embodiments include 3 inch to 8 inch drivers of nominal impedance, greater than 30 ohms, mounted in small enclosures with bass filtering with and without means of controlling the volume level.

With proper selection of driver sensitivity and network components a small driver can be reliably driven by an amplifier of up to 20 times the drivers' power rating while providing the required sound pressure level (SPL) to the user.

In operation the invention is positioned in close proximity to performers and is connected to the main amplifier of a sound system whereby the performers hear the same music mix (blend) emanating from the invention as from the main sound system. The invention is also well suited to provide monitoring of electronic music to orchestral musicians as many of the inventions can be quickly spread among the orchestra and connected in a daisy chain fashion to one amplifier. The invention is also suited to provide sound quality monitoring and sensitive feedback detection of main sound system amplifier output to sound technicians.

DESCRIPTION OF PREFERRED EMBODIMENTS

Figure 1:
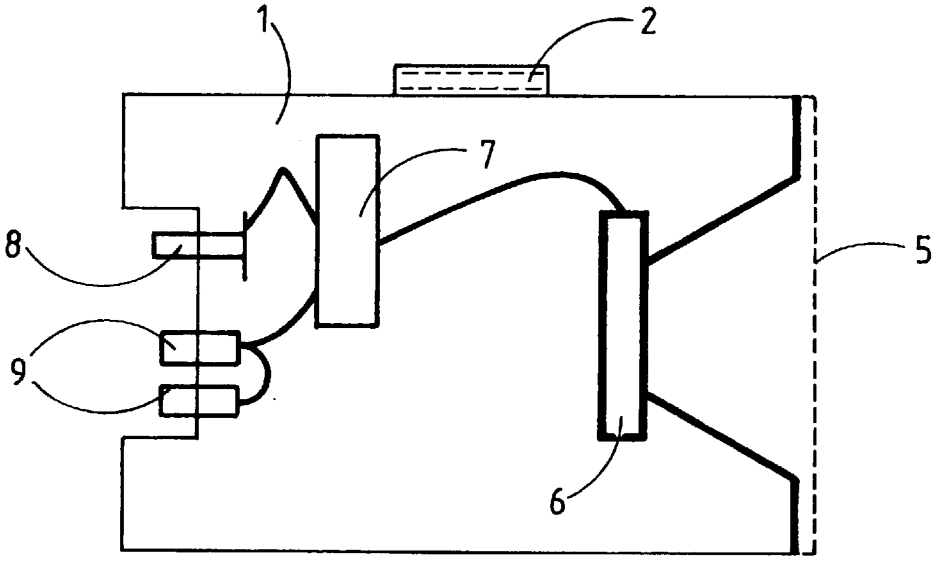
FIG. 1 is a diagrammatic representation of a the preferred embodiment of the invention.

Referring to FIG. 1, a 4 inch dynamic driver 6 is mounted in a tubular enclosure 1 approximately 4 inches diameter by 5 inches deep. The cone of the driver 6 is protected by a perforated metal grill 5. The driver is electrically connected by means of a passive network 7, volume control 8, and input connectors 9. A mounting slot 2 is provided as a means to mount the enclosure 1.

Figure 2:
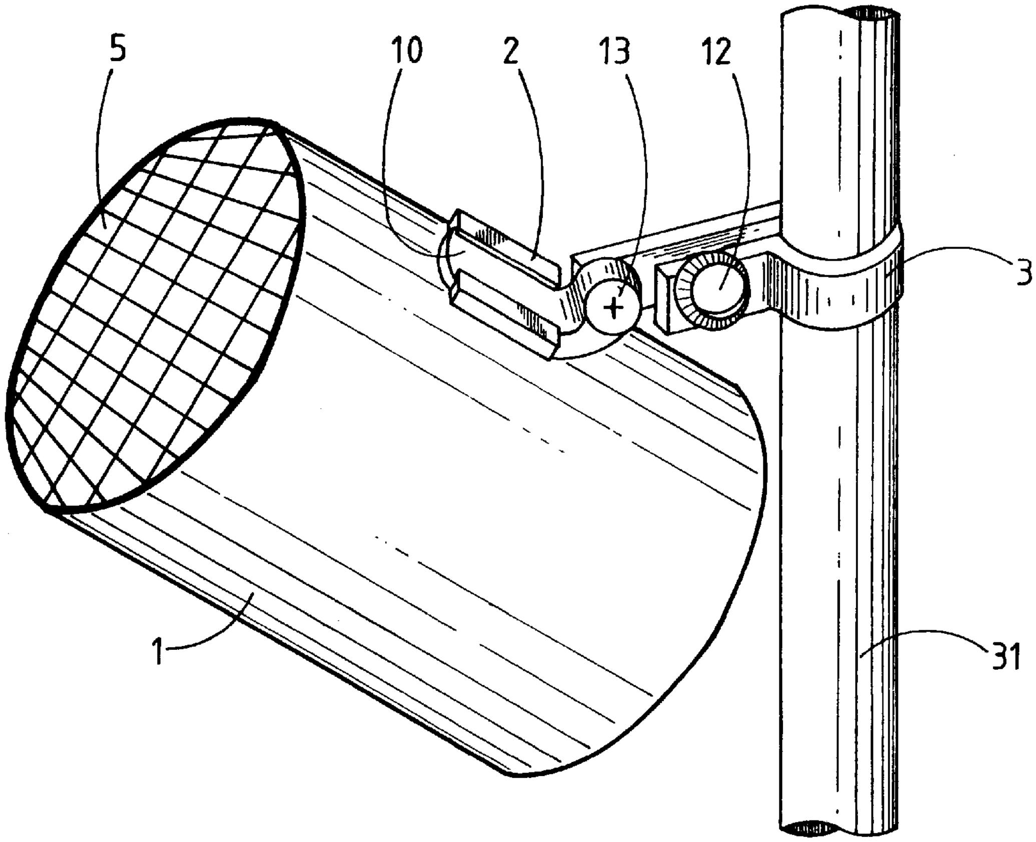
FIG. 2 is a perspective view of the FIG. 1 invention.

Referring to FIG. 2, a mounting clip 3 is permanently mounted to a mic stand, drum stand, music stand or keyboard stand 31 using thumb screw 12. The mounting slot 2 slides over the mounting clip tab 10 for instant attachment and removal. Mounting angle is adjusted by set screw 13.

Figure 3:
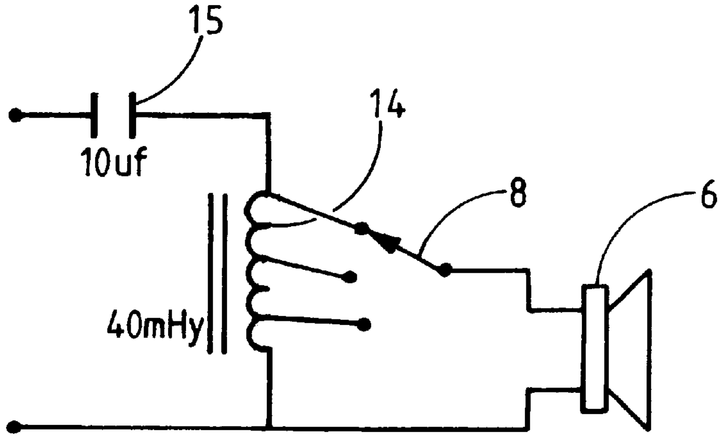
FIG. 3 is an electrical schematic of the passive network used for the FIG. 1 invention.
Figure 4:
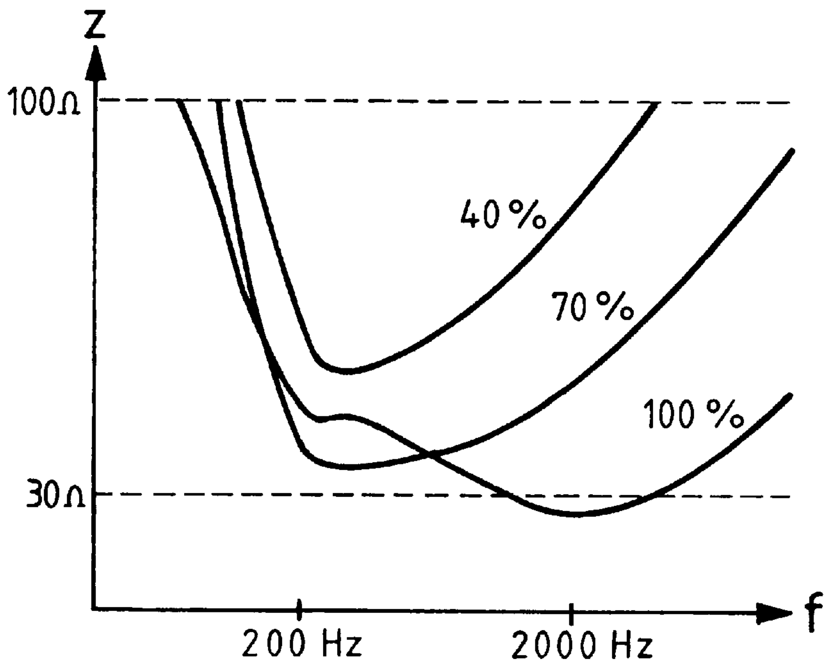
FIG. 4 is a graphical representation of the input impedance of the electrical schematic of FIG. 3.

Referring to FIG. 3, capacitor 15 and inductor 14 form a second order high pass filter with a turnover frequency of about 250 Hz. This filters out bass frequencies from the driver 6 which protects the driver 6 from excessive cone excursion and thereby improves power handling. The filter also serves to reduce amplifier loading in bass frequencies. The inductor 14 is tapped and serves as an audio autoformer. Multi-switch 8 selects the inductor 14 tap and thus serves as a volume control. With the multi-switch set a full volume (100% Tap), the minimum input impedance is 28 ohms and nominal impedance is greater than 30 ohms. Input impedances increase at lower tap settings (see FIG. 4).

The driver 6 has a nominal impedance of 32 ohms and sensitivity of 93 dB (1 w/1 m) and power rating of 25 watt RMS. System frequency response is about 250 Hz to 12 kHz±5 dB. The preferred embodiment as described performs reliably in normal live sound situations with power amplifiers that can produce 150 watt RMS to 450 watt RMS into 4 ohms.

Figure 5:
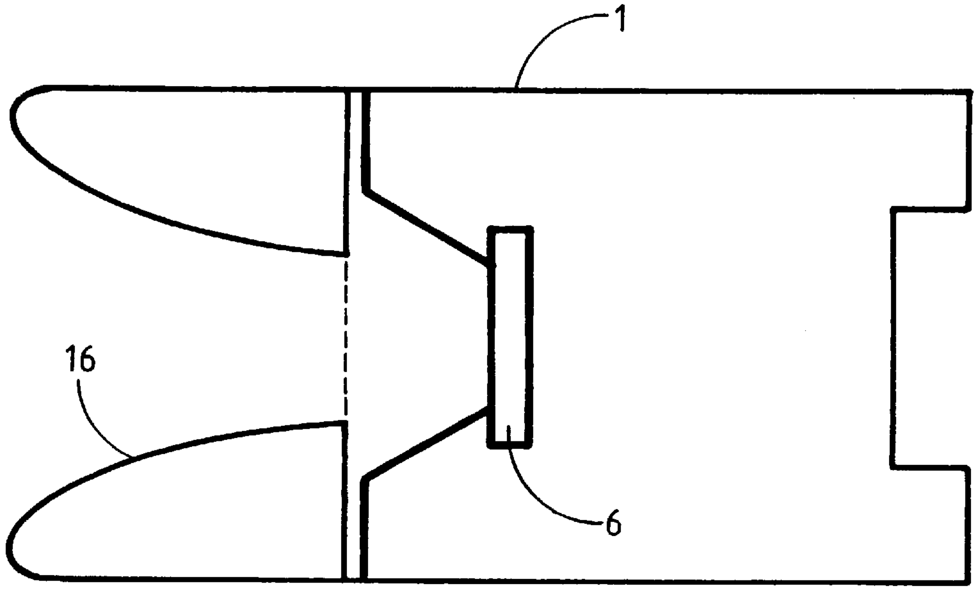
FIG. 5 illustrates a modification of the embodiment of FIG. 1 using horn loading.

Referring to FIGS. 1 and 5, the protective grill 5 may be replaced by a combination horn flare and protective grill 16 to increase mid-band directivity and sensitivity.

Figure 6:
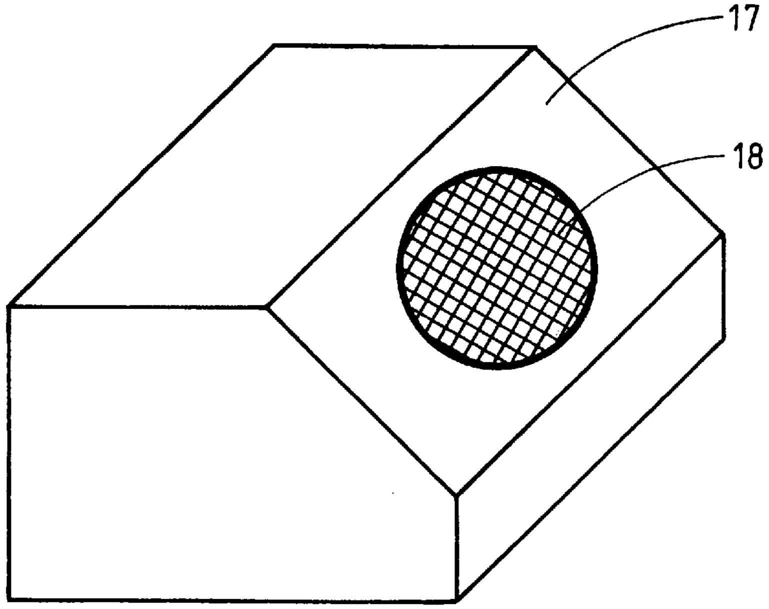
FIG. 6 illustrates modifications of the driver size and enclosure shape and material of the embodiment of FIG. 1.

FIG. 6 demonstrates that exact size and shape of the enclosure 17 is not important as long as overall size is kept to a minimum but large enough to acoustically reproduce frequencies down to about 250 Hz. The material of the enclosure 17 is also unimportant, as long as the enclosure 17 is rigid, durable, aesthetically pleasing, and inexpensive to produce. Likewise driver 18 size is unimportant and can range from 3 inches to 8 inches diameter, as long as moderate sensitivity and a minimum useable frequency response of at least 250 Hz–10 kHz is achieved.

Figure 7:
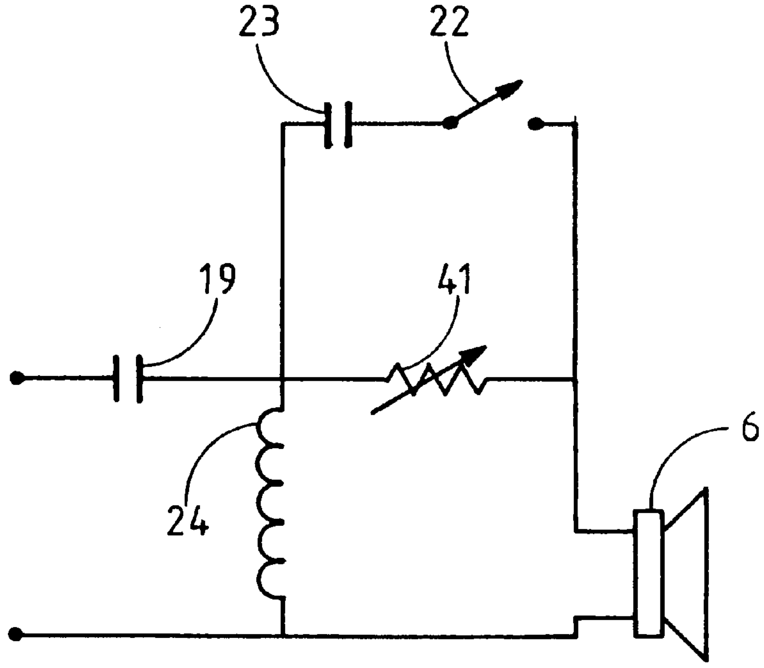
FIGS. 7, 8, 9 illustrate various embodiments of electrical schematic of the invention.
Figure 8:
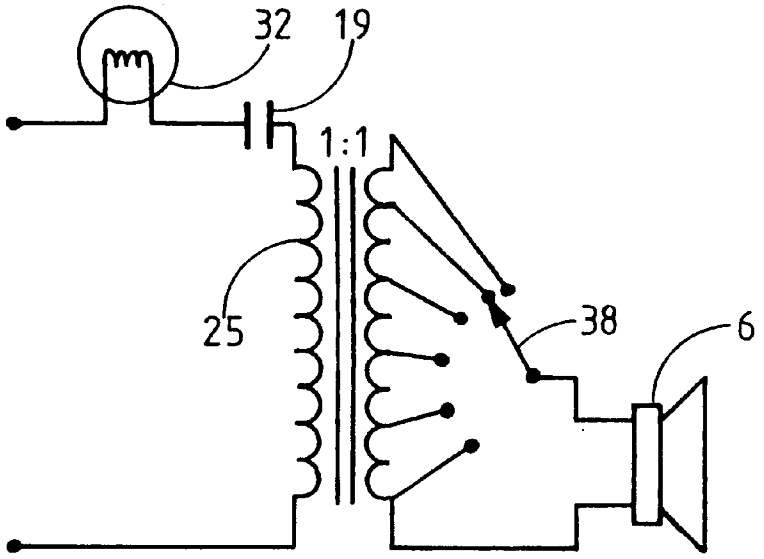
Figure 9:
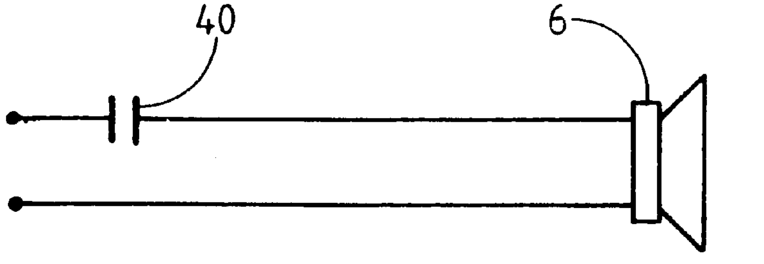

FIGS. 7, 8, and 9 illustrate various embodiments of electrical schematics of the invention. All use a dynamic driver 6 that has a nominal impedance greater than 30 ohms. All methods utilize a high pass filter to protect the dynamic driver from excessive cone excursion. First and second order filters are described but higher order filters would offer improved driver protection at increased manufacturing costs.

Referring to FIG. 7, a rheostat 41 controls the volume of a dynamic driver 6. A capacitor 19 and an inductor 24 form a high pass filter. A capacitor 23 and a switch 22 form an optional bright circuit to enhance the brilliance as the volume is reduced.

Referring to FIG. 8, an audio isolation transformer with multiple secondaries 25 and a multi-position switch 38 controls the volume level of a dynamic driver 6. A high pass filter is comprised of a capacitor 19 and the primary inductance of the transformer 25. A series light bulb 32 provides additional overpower protection.

Referring to FIG. 9, a capacitor 40 forms a simple first order high pass filter for a dynamic driver 6.

What is claimed is:

1. A compact monitor speaker system comprising:

a three to eight inch dynamic driver, said driver having a nominal impedance greater than 30 ohms, said driver mounted in an enclosure with protective grill and input connectors, means for mounting said enclosure to a stand, and a passive network including a high pass filter mounted within said enclosure, said passive network electrically connecting said driver to said input connectors.

2. The monitor speaker of claim 1 wherein said protective grill comprises horn loading of said dynamic driver.

3. The monitor speaker of claim 1 wherein said passive network includes means of controlling the volume level.

4. The monitor speaker of claim 1 wherein said passive network includes means of enhancing the brilliance.

5. The monitor speaker of claim 1 wherein said passive network includes overpower protection.

* * * * *